(12) United States Patent
Gossmann

(10) Patent No.: US 7,999,629 B2
(45) Date of Patent: Aug. 16, 2011

(54) IQ-MODULATION

(75) Inventor: Timo Gossmann, Neubiberg (DE)

(73) Assignee: Infineon Technologies AG, Neubiberg (DE)

( * ) Notice: Subject to any disclaimer, the term of this patent is extended or adjusted under 35 U.S.C. 154(b) by 178 days.

(21) Appl. No.: 12/397,093

(22) Filed: Mar. 3, 2009

(65) Prior Publication Data

US 2010/0225409 A1    Sep. 9, 2010

(51) Int. Cl.
*H04L 27/20* (2006.01)
(52) U.S. Cl. ........ 332/105; 332/103; 332/104; 332/109; 332/110; 332/120
(58) Field of Classification Search .......... 332/103–105, 332/109, 110, 120, 146
See application file for complete search history.

(56) References Cited

U.S. PATENT DOCUMENTS

| | | | |
|---|---|---|---|
| 2006/0291589 A1* | 12/2006 | Eliezer et al. | 375/302 |
| 2007/0155348 A1* | 7/2007 | Razavi et al. | 455/118 |
| 2008/0132195 A1* | 6/2008 | Maxim et al. | 455/334 |
| 2009/0225903 A1* | 9/2009 | van Waasen | 375/316 |
| 2009/0302963 A1* | 12/2009 | Ballantyne et al. | 332/105 |
| 2010/0102895 A1* | 4/2010 | Beukema et al. | 332/103 |

FOREIGN PATENT DOCUMENTS

DE    202006000197    4/2006

* cited by examiner

*Primary Examiner* — Joseph Chang
*Assistant Examiner* — Jeffrey Shin
(74) *Attorney, Agent, or Firm* — Lee & Hayes, PLLC

(57) ABSTRACT

The present disclosure relates to I/Q modulation circuits, devices, and methods.

28 Claims, 6 Drawing Sheets

IQ-MODULATION

BACKGROUND

According to a typical I/Q modulator structure, unmodulated in-phase and quadrature components of a "local oscillator" signal, which may be designated as LOI and LOQ, are offset by 90° to supply two identical mixer stages. In each mixer stage, the LOI or LOQ signal may be multiplied by a modulated in-phase or quadrature baseband signal, which may be designated as BBI or BBQ, respectively. The two mixer output signals (i.e., BBI+LOI and BBQ+LOQ) are finally summed and thus form the modulated carrier signal to be transmitted.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different instances in the description and the figures may indicate similar or identical items.

DETAILED DESCRIPTION

Disclosed herein are improved techniques for I/Q modulation. According to one implementation, an I/Q modulator device may include a first component configured to combine an in-phase component of a local oscillator signal with a sign of an in-phase component of a baseband signal to generate an output signal of the first component. The I/Q modulator may also include a second component configured to combine a quadrature component of a local oscillator signal with a sign of a quadrature component of a baseband signal to generate an output signal of the second component. The I/Q modulator may further include a third component configured to combine the output signal of the first component with a magnitude of the in-phase component of the baseband signal to generate an output signal of the third component. A fourth component may be configured to combine the output signal of the second component with a magnitude of the quadrature component of the baseband signal to generate an output signal of the fourth component. The I/Q modulator may still further include a fifth component configured to combine the outputs of the third and fourth components to generate an output signal of the I/Q modulator. The first and second components may be multiplier devices. The third and fourth components may be mixer devices. The fifth component may be a summation device.

According to an implementation, a mixer is disclosed for generating an in-phase component or quadrature component of an I/Q modulator signal. The mixer includes an input for receiving a signal representing the magnitude of an in-phase or quadrature component of a baseband signal, an input for receiving a signal representing a combination of an in-phase or quadrature component of a local oscillator signal, and an output for generating the in-phase or quadrature component of the modulator signal.

According to another implementation, a local oscillator signal processing device is disclosed. The local oscillator signal processing device may include a first component for generating in-phase and quadrature components of a local oscillator signal; and a second component for synchronizing the in-phase and quadrature components of the local oscillator signal to a reference clock. The first and second components may include flip-flop devices. The reference clock may be based on or derived from an output from a voltage controlled oscillator or other signal generating or processing device.

According to still another implementation, a method is described that may be used for generating an in-phase component and/or quadrature component of an I/Q modulator signal.

Illustrative Device

Figure 1:
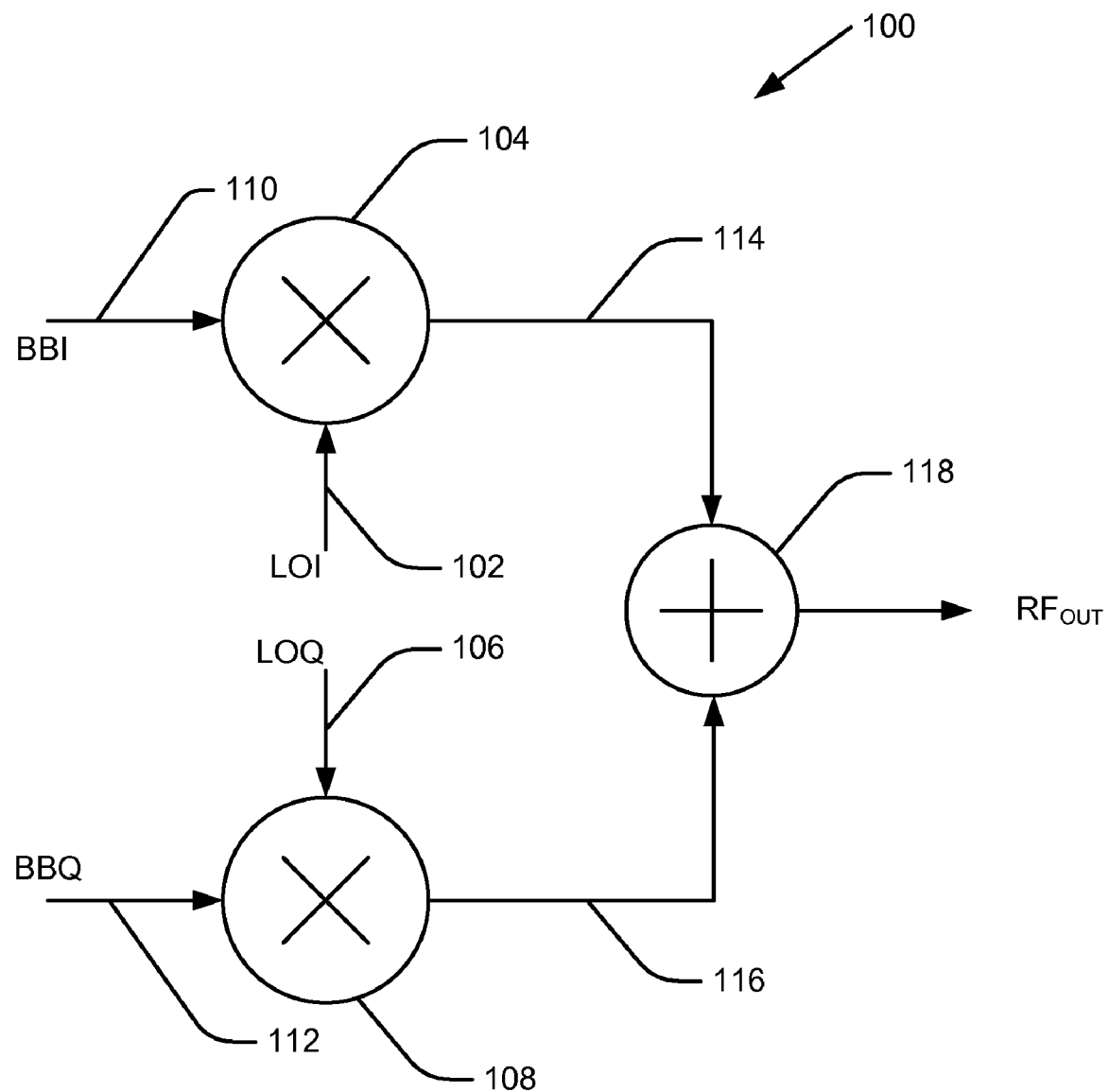
FIG. 1 is a simplified schematic diagram of an I/Q modulator device.

FIG. 1 shows an implementation of an IQ modulator 100. Two local oscillator signals, which may be generally designated as LOI and LOQ, are offset by 90° to supply two mixer stages. The LOI signal is provided along path 102 to mixer 104, while the LOQ signal is provided along path 106 to mixer 108. A modulated baseband signal may also be provided and represented by I and Q components, which may be generally designated as BBI and BBQ. The BBI signal may be provided along path 110 to mixer 104, while the BBQ signal may be provided along path 112 to mixer 108. In mixer 104, the LOI signal may be multiplied by the BBI signal to provide a mixer output signal along path 114. In mixer 108, the LOQ signal may be multiplied by the BBQ signal to provide a mixer output signal along path 116. The two mixer output signals provided along paths 114 and 116 are summed at summation component 118 to form the modulated carrier signal, $RF_{out}$. For sinusoidal signals, the $RF_{out}$ may be represented using the following equation:

$$RF_{out} = BBI \cdot A \cdot \cos(2\pi f \cdot t) - BBQ \cdot A \sin(2\pi f \cdot t) \quad (1)$$

It is noted that, in certain implementations of a circuit for generating LOI and LOQ signals, bipolar (i.e., differential) rectangular signals may be used rather than sine and cosine signals. The rectangular signals are often preferred in order to change as rapidly as possible between the signal values (+A) and (−A) in differential signal representation, thus resulting in faster switching speeds with better noise properties in the mixer. Moreover, it may be significantly simpler to generate rectangular signals with a defined phase offset.

The higher harmonics contained in the rectangular signals or their mixing products with the baseband signals can be sufficiently suppressed after summation by means of low-pass filtering. In equation 1, for mapping the real circuit function, the sine and cosine terms may be replaced by the series expansions of the rectangular signals as is well known to those skilled in the art.

In modern modulator implementations, the two baseband signals (BBI and BBQ) may be generated from digital data by means of two DACs and, if appropriate, subsequent low-pass filtering and are then applied directly to the baseband inputs of the mixers. The digital to analog converter or mixer current may decrease linearly with the baseband signal voltage, by operating the DAC, the mixer or their combination in class B operation, i.e. as a unipolar digital to analog converter. Thus, the average power consumption for the circuit is reduced.

The BBI and BBQ signals may be represented by a magnitude component and a sign component. The unipolar DAC is utilized to generate BBI and BBQ signals representing the magnitude of the signal. The LOI and LOQ signals may be utilized to factor, preserve, or otherwise represent the sign (+/−) of the BBI and BBQ signals, respectively. Thus, in accordance with this technique, Equation (1) may be written with the signum function sign ( . . . ) as:

$$RF_{out} = [|BBI| \cdot \text{sign}(BBI)] \cdot A \cdot \cos(2\pi f \cdot t) - [|BBQ| \cdot \text{sign}(BBQ)] \cdot A \cdot \sin(2\pi f \cdot t) \quad (2)$$

The sign (+/−) can likewise be assigned to the LOI and LOQ signals as represented in Equation (3).

$$RF_{out} = |BBI| \cdot [\text{sign}(BBI) \cdot A \cdot \cos(2\pi f \cdot t)] - |BBQ| \cdot [\text{sign}(BBQ) \cdot A \cdot \sin(2\pi f \cdot t)] \quad (3)$$

Figure 2:
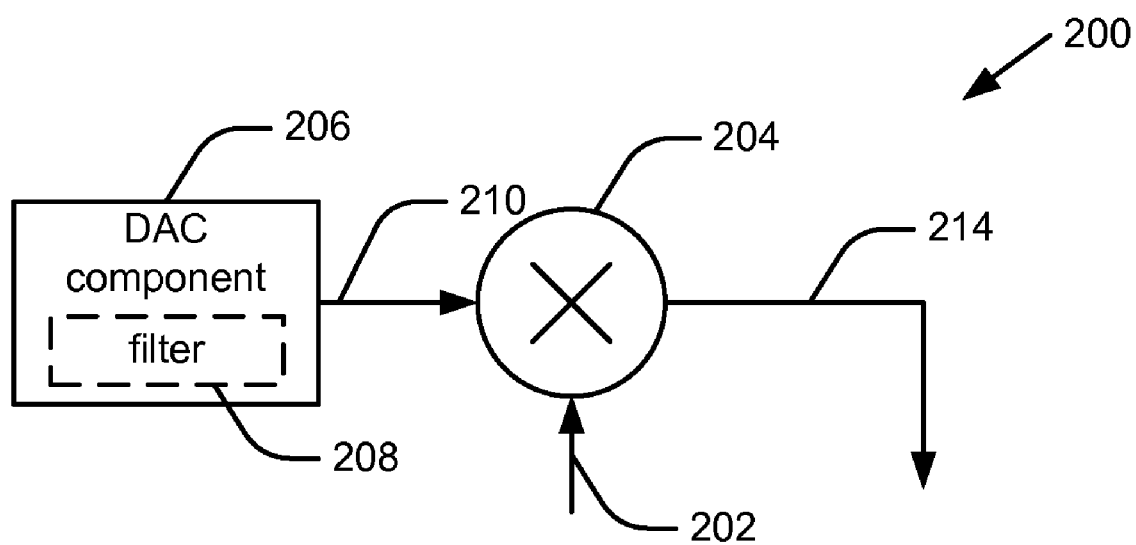
FIG. 2 is a simplified schematic diagram of a circuit to generate an in-phase or quadrature component of an I/Q modulator signal.

FIG. 2 shows a simplified schematic diagram of a circuit 200 to generate an in-phase or quadrature component of an I/Q modulator signal. According to this example, local oscillator signals, which may be provided as differential signals LOp and LOn, carry the phase modulation along path 202. The local oscillator signals are provided to a mixer 204, which may correspond to mixer 104 or 108 in FIG. 1. A digital to analog converter component 206 supplies a non-differential, unipolar, or unimodal positive voltage or current value (i.e., the magnitude of the baseband signal) using a digital analog converter. The digital to analog converter component 206 may optionally include a low pass filter 208 in addition to the digital to analog converter.

According to one exemplary implementation, the mixer 204 is configured to combine the signal output by the digital to analog converter component 206 (i.e., the magnitude of the baseband signal) along path 210 with a signal provided along path 202, which may include a differential signal representing a local oscillator signal (i.e., LOp and LOn) combined with a signal representing a sign (+/−) of the baseband signal. The mixer 204 may be thus configured to generate the in-phase or quadrature component of the I/Q modulator circuit output signal along path 214. By providing the sign (+/−) of the baseband signal with the local oscillator signal, the digital to analog converter may be operated at lower power according to a class B operating mode.

Figure 3:
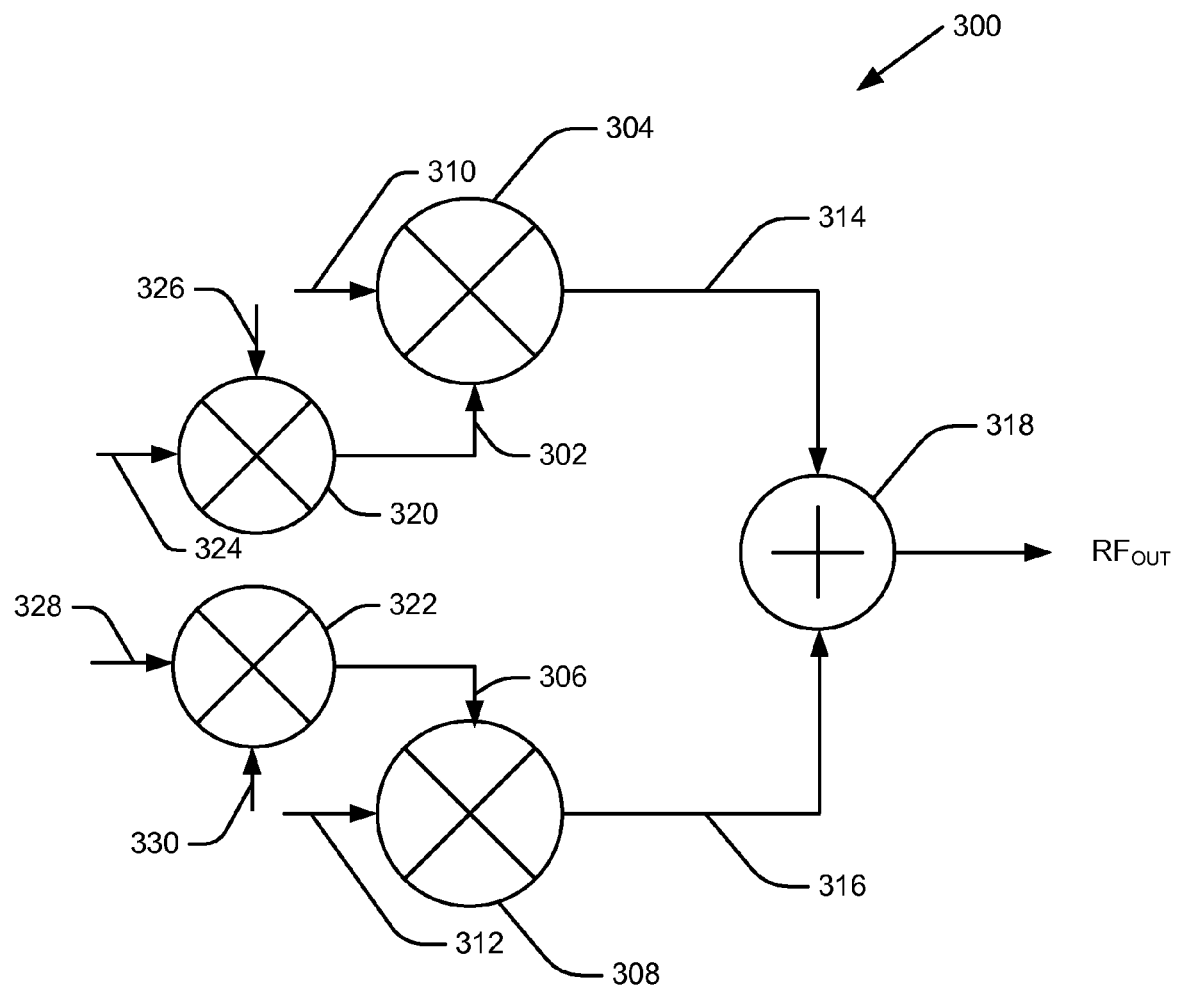
FIG. 3 is a simplified schematic diagram of an I/Q modulator device.

FIG. 3 shows a simplified schematic of an IQ modulator device 300, which may be used in an electronic environment, such as a wireless device. Generally speaking, the I/Q modulator device 300 may include a first modulator component 320, a second modulator component 322, a third modulator component 304, a fourth modulator component 308, and a fifth modulator component 318. According to one example, the first, second (320, 322) modulator components are multiplier components, the third and fourth modulator components, 304, and 308 are mixer devices and the fifth modulator component 318 is a summation device.

The first modulator component 320 is configured to combine an in-phase component of a local oscillator signal (LOI) along path 324 with a signal representing a sign (+/−) of an in-phase component of a baseband signal along path 326 to generate an output signal (LOI(+/−)) of the first modulator component 320 along path 302. The second modulator component 322 is configured to combine a quadrature component of a local oscillator signal (LOQ) along path 328 with a signal representing a sign (+/−) of a quadrature component of a baseband signal along path 330 to generate an output signal (LOQ(+/−)) of the second modulator component 322 along path 306. The third modulator component 304 is configured to combine the output signal (LOI(+/−)) of the first modulator component provided along path 302 with a signal representing a magnitude of the in-phase component of the baseband signal (|BBI|) along path 310 to generate an output signal of the third modulator component 304 along path 314. The fourth modulator component 308 is configured to combine the output signal of the second modulator component (LOQ (+/−)) provided along path 306 with a signal representing a magnitude of the quadrature component of the baseband signal (|BBQ|) along path 312 to generate an output signal of the fourth modulator component 308 along path 316. The fifth modulator component 318 is configured to combine the output signals of the third and fourth modulator components (304 and 308) to generate an output signal of the I/Q modulator, $RF_{OUT}$.

Figure 4:
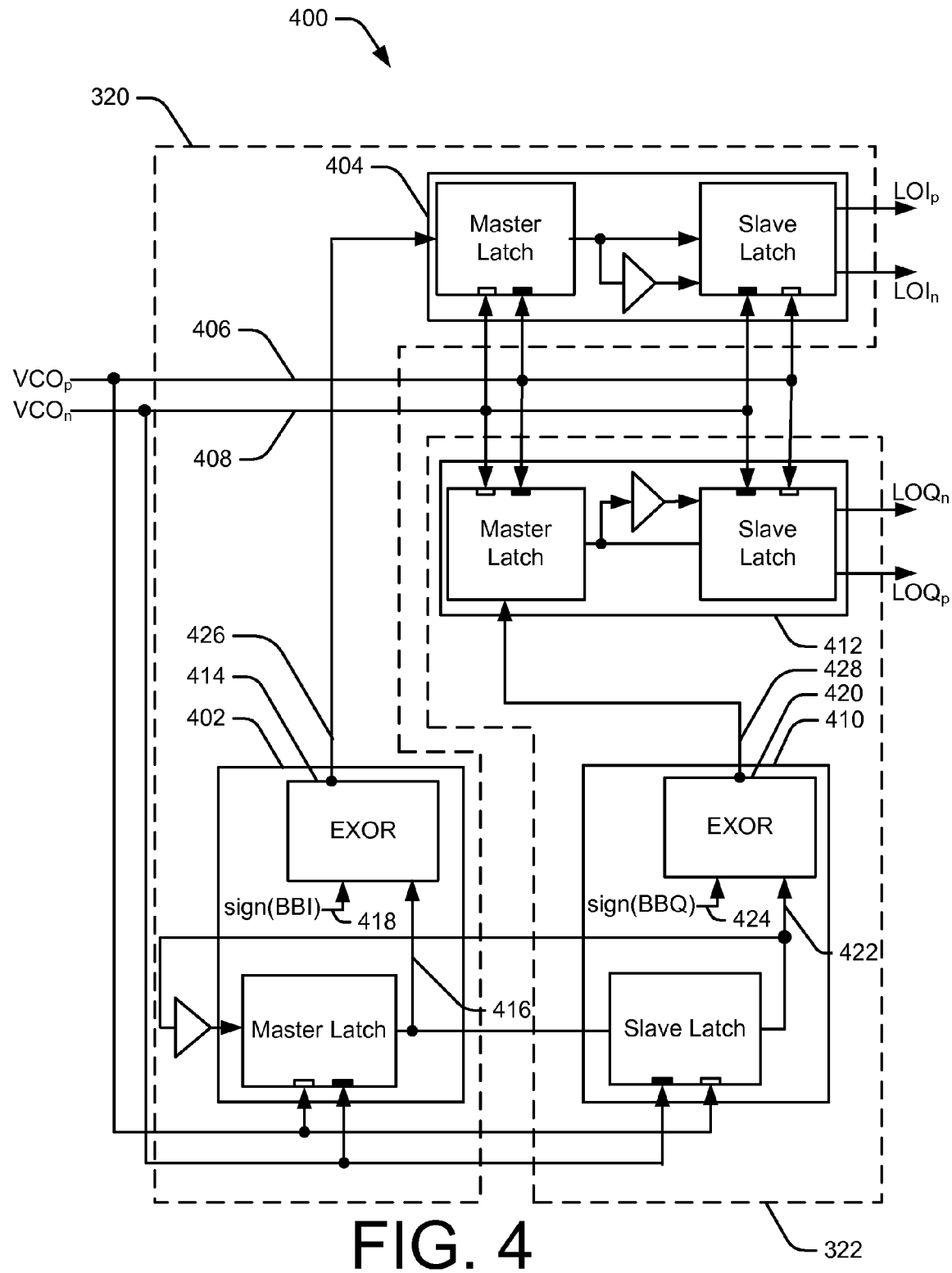
FIG. 4 is a simplified schematic diagram of a local oscillator signal processing device.

FIG. 4 shows an exemplary implementation of a local oscillator signal processing device 400 comprising the first modulator component 320 and second modulator component 322 of FIG. 3. Generally speaking, the first modulator component 320 has a first subcomponent 402 for generating an in-phase component of the local oscillator signal (LOI(+/−)), and a second subcomponent 404 for synchronizing the LOI (+/−) signal to a reference clock provided along paths 406 and 408. The second modulator component 322 includes a first subcomponent 410 for generating a quadrature component of the local oscillator signal (LOQ(+/−)) and a second subcomponent 412 for synchronizing the LOQ(+/−) signal to the reference clock provided along paths 406 and 408.

The reference clock may be generated by a voltage controlled oscillator (VCO) or other suitable source. According to one implementation, the reference clock frequency is at an even multiple of the LOI/Q signal frequency and is synchronous to it. In the example configuration shown in FIG. 4, the reference clock is equal to the input clock of the LOI/Q generating devices (i.e., 404 and 412). However, the device 400 may alternatively be provided a reference clock signal that is provided at an even order harmonic frequency of a frequency of an unprocessed local oscillator signal, e.g., double the generated LOI/Q frequency. Thus, the spectral purity (attributable to low jitter) of the reference clock determines the phase noise performance of the device 400 and, more generally, the IQ modulator device 300, the mixer 500 (described below), and so forth.

As shown in FIG. 4, the first subcomponent 402 of the first modulator component 320 and the first subcomponent 410 of the second modulator component 322 are coupled as a first component of the local oscillator signal processing device 400 and form a first flip-flop circuit, such as a master-slave slip-flop circuit. Additionally, the second subcomponent 404 of the first modulator component 320 and the second subcomponent 412 of the second modulator component 322 are coupled as a second component of the local oscillator signal processing device 400 and form a second flip-flop circuit, such as a master-slave flip-flop circuit.

According to one implementation, the first flip flop circuit (402 and 410) and the second flip-flop circuit (404 and 412) consume approximately the same amount of current. According to one alternative implementation, the first flip flop circuit (402 and 410) consumes a first amount of current, the second flip-flop circuit (404 and 412) consumes a second amount of current, and the second amount of current is higher than the first amount of current. This may be the result of designing the first-flip circuit (402 and 410) to operate at a lower power, and thus lower noise, than the second flip-flop circuit (404 and 412). In fact, it may suffice to form only the slave part of the second flip-flop circuit (404 and 412) in strong (i.e., noise-optimized) fashion.

The shown configuration for generating 90 degree offset local oscillator signals (i.e. the circuit including subcomponents 402 and 410, though not necessarily including 414 and 420) is one exemplary configuration for generating 90 degree offset local oscillator signals. However, as will be appreciated by one skilled in the art, other known implementations may be used in the general context shown in FIG. 4 to switch the local oscillator phases. For example, a more general means to switch the local oscillator phases includes using multipliers 320 and 322, as shown in FIG. 3.

The first subcomponent 402 of the first modulator component 320 may include at least one EXOR gate 414 for combining the in-phase component of the local oscillator signal (LOI) provided along path 416 with the signal representing the sign (+/−) of the in-phase component of the baseband signal (BBI) provided along path 418. Similarly, the first subcomponent 410 of the second modulator component 322 may include at least one EXOR gate 420 for combining the quadrature component of the local oscillator signal (LOQ) provided along path 422 with the signal representing the sign (+/−) of the quadrature component of the baseband signal provided along path 424. The LOI(+/−) and LOQ(+/−) signals output by the EXOR gates 414 and 420 along paths 426 and 428, respectively, may be differential or non-differential signals.

The second subcomponents (404 and 412) of the first and second modulator components (320 and 322) may be configured to retime signals output by the EXOR gates (414 and 420) in order to reduce or eliminate signal propagation delay introduced by the EXOR gates (414 and 420). More particularly, the second flip flop circuit (404 and 412), as shown, includes a flip flop device in the second subcomponent 404 and a flip flop device in the second subcomponent 412. The flip flop device in the second subcomponent 404 has a data input (along path 426) coupled to the EXOR gate 414 of the first sub-component 402 and two clock inputs (along paths 406 and 408) configured to receive a reference clock signal (with I and Q components) having a frequency that is an even order harmonic frequency of a frequency of an unprocessed local oscillator signal. The flip flop device in the second subcomponent 412 has a data input (along path 428) coupled to the EXOR gate 420 and two clock inputs (along paths 406 and 408) configured to receive a reference clock signal (with I and Q components) having a frequency that is an even order harmonic frequency of a frequency of an unprocessed local oscillator signal.

The clock-synchronized in-phase and quadrature components of the local oscillator output signal output by the second subcomponents (404 and 412) of the first and second modulator components (320 and 322) may be provided as differential signals ($LOI_p/LOI_n$ and $LOQ_p/LOQ_n$) to be provided to mixers 304 and 308, shown in FIG. 3.

Figure 5:
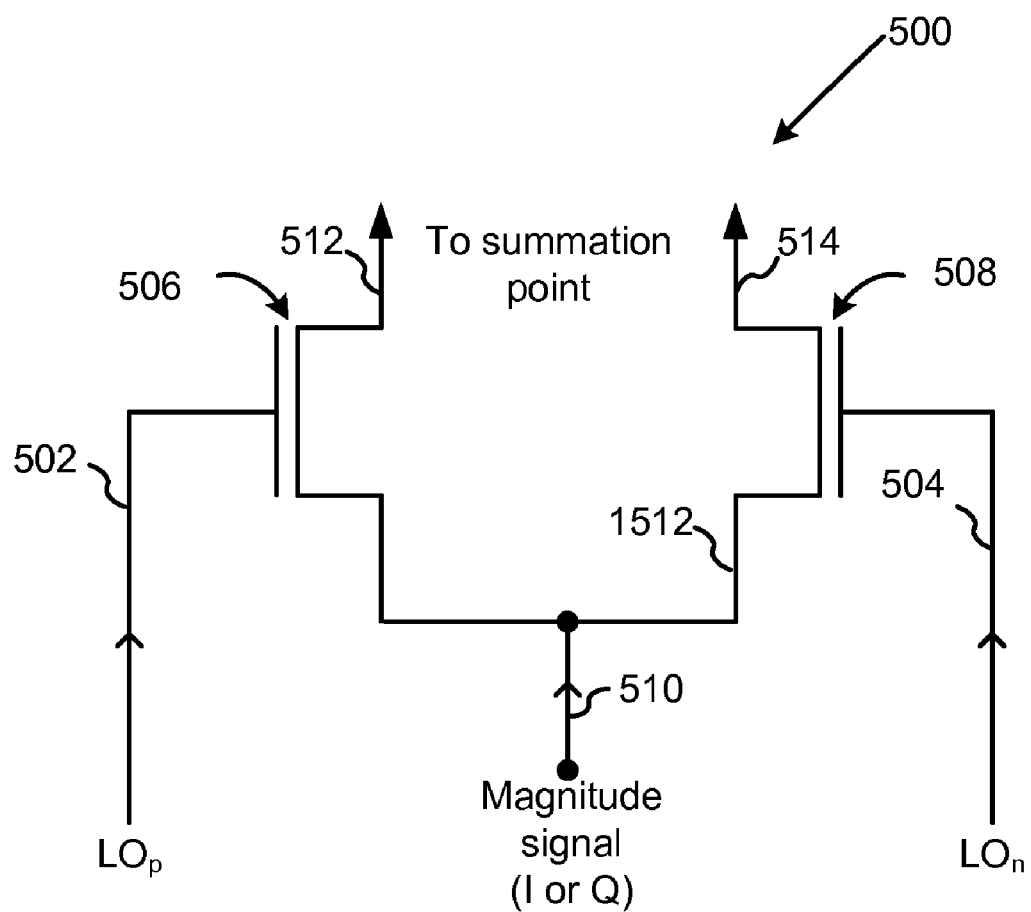
FIG. 5 is simplified schematic diagram of a mixer that may be used in the I/Q modulator devices described with reference to FIGS. 1 and 3.

FIG. 5 shows a simplified schematic diagram of a mixer 500 in an I/Q modulator, which may receive the output from, for example, local oscillator signal processing device 400, shown in FIG. 4. The mixer 500 may be used as mixer 304 or 308, shown in FIG. 3, for generating an in-phase component or quadrature component of an I/Q modulator signal, respectively.

The mixer 500 may receive the $LOI_p$ and $LOI_n$ (or $LOQ_p$ and $LOQ_n$) differential signals output by the local oscillator signal processing device 400 along input paths 502 and 504 to the gates of transistors 506 and 508, respectively. A signal representing the magnitude of in-phase (or quadrature) component of the baseband signal may be provided to the mixer 500 along an input path 510. The mixer 500 may generate differential output signals along output paths 512 and 514, which may then be provided to a summation device, such as summation device 318, to be used for generating output signal $RF_{OUT}$, as shown in FIG. 3.

Illustrative Method

Figure 6:
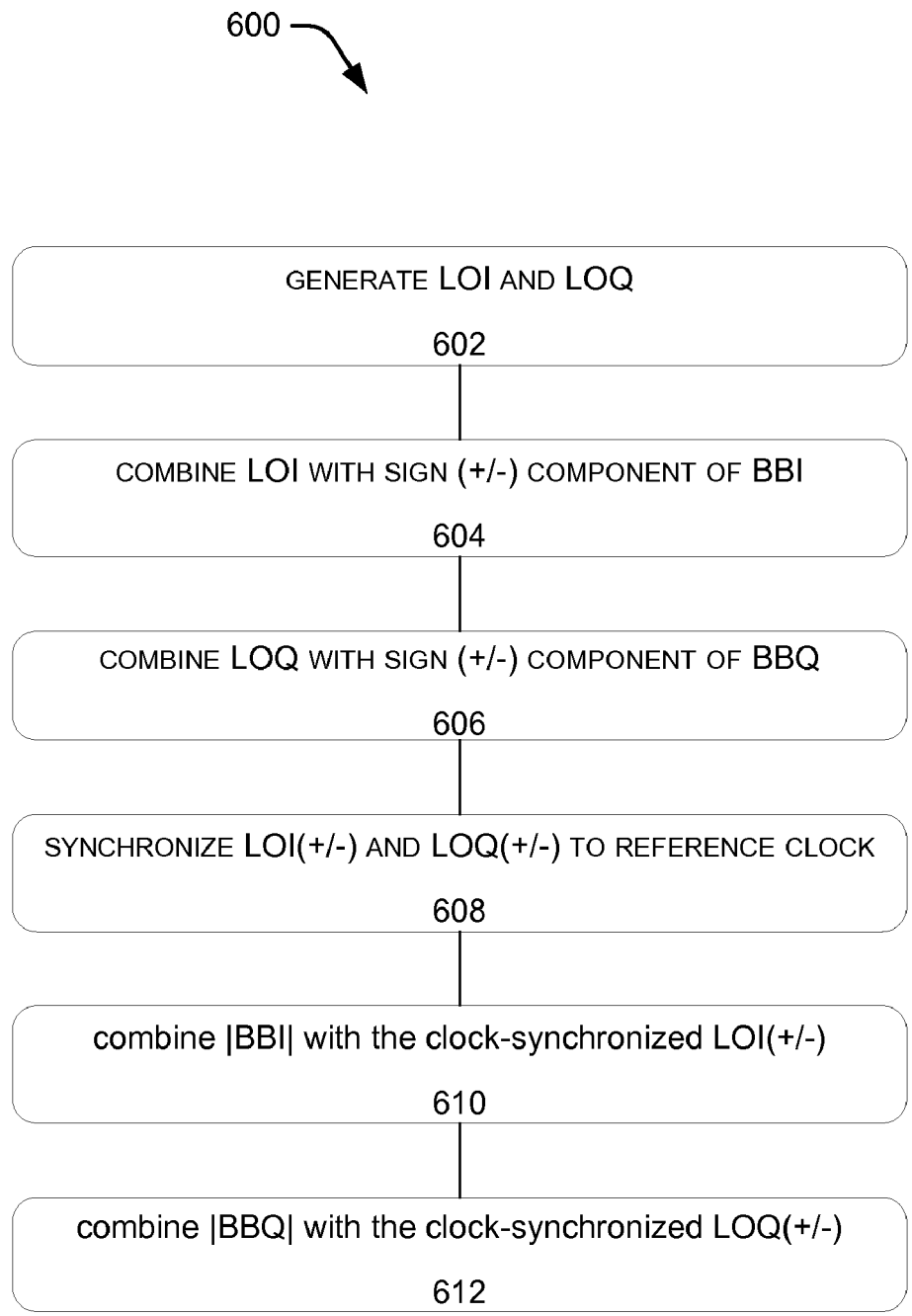
FIG. 6 is a flow diagram of an exemplary method to generate I and Q components of an I/Q modulated signal.

FIG. 6 is a flow diagram depicting a method 600 according to the present teachings. The method 600 includes particular steps and order of execution. However, it is to be understood that other methods may include other steps, and/or omit one or more of the depicted steps, and/or proceed in other orders of execution in accordance with the present teachings. In the interest of clarity, and not for limitation, the method 600 will be described with reference to FIGS. 3-5.

At 602, in-phase and quadrature components of a local oscillator signal (i.e., LOI and LOQ) are generated.

At 604, the in-phase component of the local oscillator signal (LOI) is combined with a sign component (+/−) of an in-phase component of a baseband signal (BBI). This process may be performed using an EXOR gate, such as EXOR gate 414.

At 606, the quadrature component of the local oscillator signal (LOQ) is combined with a sign component (+/−) of a quadrature component of the baseband signal (BBI). This process may be performed using an EXOR gate, such as EXOR gate 414.

At 608, the combined in-phase component signal (LOI (+/−)) and the combined quadrature component signal (LOQ (+/−)) are synchronized to a reference clock to provide clock-synchronized in-phase and quadrature components of the local oscillator signal. According to one exemplary implementation, the LOI(+/−) and LOQ(+/−) signals are non-differential or differential signals before the synchronization process, and the clock-synchronized LOI and LOQ signals are provided as differential signals ($LOI_p/LOI_n$ and $LOQ_p/LOQ_n$) during or after the synchronization process. The resynchronization of the polarity changeover prevents a situation in which short LOI or LOQ spikes would occur in the case of an unfavorable temporal reference of the (+/−) signals with respect to the LOI or LOQ signal, as would be the case with purely combinational switching of the LO polarity.

At 610, a signal representing a magnitude of the in-phase component of the baseband signal (|BBI|) is combined with the clock-synchronized LOI(+/−) signal. The |BB| signal may be provided by a digital-to-analog converter according to a class B operation. The process of combining the |BB| and LOI(+/−) signals may be performed using a mixer, such as mixer 304.

At 612, a signal representing a magnitude of the quadrature component of the baseband signal (|BBQ|) is combined with the clock-synchronized LOQ(+/−) signal. The |BBQ| signal may be provided by a digital-to-analog converter according to a class B operation. The process of combining the |BBQ| and clock-synchronized LOQ(+/−) signals may be performed using a mixer, such as mixer 308.

The combined |BBI|/clock-synchronized LOI(+/−) and |BBQ|/clock-synchronized LOQ(+/−) signals may be further processed, such as by using a summation device (e.g. 118, 318) to generate an output signal $RF_{OUT}$ of an I/Q modulator device (e.g. 100, 300).

Conclusion

The implementations described herein are not restricted to digital signals and DACs for generating BBI and BBQ signals. The techniques may be applied directly to analog BBI and BBQ mixer input signals (current or voltage) provided that the signal can be divided into magnitude and sign, e.g. by means of rectification and limiter amplifiers. One or more of the signals discussed herein may be provided as current signals, voltage signals, single-ended signals or differential signals.

For the purposes of this disclosure and the claims that follow, the terms "coupled" and "connected" have been used to describe how various elements interface. Such described interfacing of various elements may be either direct or indirect. Although the subject matter has been described in language specific to structural features and/or methodological acts, it is to be understood that the subject matter defined in the appended claims is not necessarily limited to the specific features or acts described. Rather, the specific features and acts are disclosed as preferred forms of implementing the claims. The specific features and acts described herein and variations of these specific features and acts may be implemented separated or may be combined.

The invention claimed is:

1. An I/Q modulator device comprising:
a first modulator component comprising at least one EXOR gate to combine an in-phase component of a local oscillator signal with a signal representing a sign of an in-phase component of a baseband signal to generate an output signal of the first modulator component;
a second modulator component comprising at least one additional EXOR gate to combine a quadrature component of a local oscillator signal with a signal representing a sign of a quadrature component of a baseband signal to generate an output signal of the second modulator component;
a third modulator component configured to combine the output signal of the first modulator component with a signal representing a magnitude of the in-phase component of the baseband signal to generate an output signal of the third modulator component;
a fourth modulator component configured to combine the output signal of the second modulator component with a signal representing a magnitude of the quadrature component of the baseband signal to generate an output signal of the fourth modulator component; and
a fifth modulator component configured to combine the output signals of the third and fourth modulator components to generate an output signal of the I/Q modulator.

2. The I/Q modulator device according to claim 1, wherein the I/Q modulator device is configured to retime signals output by the at least one EXOR gate and the at least one additional EXOR gate to reduce or eliminate signal propagation delay introduced by the at least one EXOR gate and the at least one additional EXOR gate.

3. The I/Q modulator device according to claim 1, further comprising: a flip flop circuit to retime signals output by the at least one EXOR gate and the at least one additional EXOR gate, the flip flop circuit including a first flip flop device and a second flip flop device,
the first flip flop device having a data input coupled to the at least one EXOR gate of the first modulator component and a clock input configured to receive a reference clock signal having a frequency that is an even order harmonic frequency of a frequency of an unprocessed local oscillator signal,
the second flip flop device having a data input coupled to the at least one additional EXOR gate of the second modulator component and a clock input configured to receive a reference clock signal having a frequency that is an even order harmonic frequency of a frequency of an unprocessed local oscillator signal.

4. The I/Q modulator device according to claim 3, wherein one or more signals of the I/Q modulator device are electrical voltages.

5. The I/Q modulator device according to claim 3, wherein one or more signals of the I/Q modulator device are electrical currents.

6. The I/Q modulator device according to claim 3, wherein one or more signals of the I/Q modulator device are differential signals.

7. The I/Q modulator device according to claim 3, wherein one or more signals of the I/Q modulator device are single-ended signals.

8. The I/Q modulator device according to claim 1, wherein the first and second modulator components are multiplier devices, the third and fourth modulator components are mixer devices, and the fifth modulator component is a summation device.

9. The I/Q modulator device according to claim 1, wherein
the first modulator component comprises:
a first subcomponent for generating the in-phase component of the local oscillator signal, and
a second subcomponent for synchronizing the in-phase component of the local oscillator signal to a reference clock; and
the second modulator component comprises:
a first subcomponent for generating the quadrature component of the local oscillator signal, and
a second subcomponent for synchronizing the quadrature component of the local oscillator signal to the reference clock.

10. The I/Q modulator device according to claim 9, wherein the first subcomponent of the first modulator component and the first subcomponent of the second modulator component are coupled to form a first flip-flop circuit and the second subcomponent of the first modulator component and the second subcomponent of the second modulator component are coupled to form a second flip-flop circuit.

11. The I/Q modulator device according to claim 10, wherein the first flip-flop circuit consumes a first amount of current and the second flip-flop circuit consumes a second amount of current, the second amount of current being higher than the first amount of current.

12. The I/Q modulator device according to claim 9, wherein the first subcomponent of the first component further comprises the at least one EXOR gate for combining the in-phase component of the local oscillator signal with the signal representing the sign of the in-phase component of the baseband signal, and
the first subcomponent of the second component further comprises the at least one additional EXOR gate for combining the quadrature component of the local oscillator signal with the signal representing the sign of the quadrature component of the baseband signal.

13. The I/Q modulator device according to claim 10, wherein the in-phase and quadrature components of the local oscillator signal output by the first flip flop circuit are non-differential signals and the clock synchronized in-phase and quadrature components of the local oscillator output signal output by the second flip-flop circuit are differential signals.

14. The I/Q modulator device according to claim 10, wherein the in-phase and quadrature components of the local oscillator signal output by the first flip flop circuit are differential signals and the clock synchronized in-phase and quadrature components of the local oscillator output signal output by the second flip-flop circuit are differential signals.

15. A wireless device comprising the I/Q modulator device according to claim 1.

16. A mixer in an I/Q modulator device for generating an in-phase component or quadrature component of an I/Q modulator signal, the mixer comprising:

an input for receiving a signal representing the magnitude of an in-phase or quadrature component of a baseband signal;

an input for receiving a differential signal representing a combination of an in-phase or quadrature component of a local oscillator signal and a signal representing the sign of the in-phase or quadrature component of the baseband signal; and an output for generating the in-phase or quadrature component of the modulator signal.

17. A circuit to generate an in-phase or quadrature component of an I/Q modulator circuit output signal, the circuit comprising:

a component to generate a non-differential signal representing a magnitude of a baseband signal; and a mixer configured to combine the non-differential signal output by the component with a differential signal representing a local oscillator signal combined with a signal representing a sign of the baseband signal, the mixer configured to generate the in-phase or quadrature component of the I/Q modulator circuit output signal.

18. The circuit according to claim 17, wherein the component is a digital to analog converter.

19. A local oscillator signal processing device comprising:

a first component to generate an in-phase component of a local oscillator signal;

a second component coupled to the first component, the second component to synchronize signals output by the first component to a reference clock and generate clock-synchronized in-phase output signals;

a third component to generate a quadrature component of the local oscillator signal, a subcomponent of the third component coupled to a subcomponent of the first component to form a master-slave latch flip-flop circuit; and a fourth component coupled to the third component, the fourth component to synchronize signals output by the third component to the reference clock to generate clock-synchronized quadrature output signals.

20. The local oscillator signal processing device according to claim 19, wherein the second component includes a flip-flop circuit, the fourth component includes an additional flip-flop circuit and the reference clock is based on an output from a voltage controlled oscillator.

21. The local oscillator signal processing device according to claim 20, wherein the flip-flop circuit and the additional flip-flop circuit are each configured with a master-slave latch configuration.

22. The local oscillator signal processing device according to claim 20, wherein the first component comprises at least one EXOR gate for combining the in-phase component of the local oscillator signal with a signal representing a sign of an in-phase component of a baseband signal and the third component comprises at least one additional EXOR gate for combining the quadrature component of the local oscillator signal with a signal representing a sign of a quadrature component of a baseband signal.

23. The local oscillator signal processing device according to claim 19, wherein the in-phase and quadrature components of the local oscillator signal are digital signals.

24. An I/Q modulator device configured to receive the output of the local oscillator of claim 19, the I/Q modulator device comprising:

a mixer configured to operate in a class B mode to combine the clock-synchronized in-phase and quadrature signals output by the local oscillator signal processing device with signals representing the magnitudes of in-phase and quadrature components of the baseband signal.

25. A method comprising:

combining an in-phase component of a local oscillator signal with a sign component of an in-phase component of a baseband signal;

combining a quadrature component of the local oscillator signal with a sign component of a quadrature component of the baseband signal; and synchronizing the combined in-phase component signal and the combined quadrature component signal to a reference clock to generate a clock-synchronized in-phase component of the local oscillator signal and a clock-synchronized quadrature component of the local oscillator signal.

26. The method according to claim 25, wherein the in-phase and quadrature components of the local oscillator signal are non-differential signals and the clock-synchronized in-phase and quadrature components of the local oscillator signal are differential signals.

27. The method according to claim 25, further comprising:

combining a signal representing a magnitude of the in-phase component of the baseband signal with the clock-synchronized in-phase component of the local oscillator signal; and combining a signal representing a magnitude of the quadrature component of the baseband signal with the clock-synchronized quadrature component of the local oscillator signal.

28. The method according to claim 25, wherein the signal representing the magnitude of the in-phase component of the baseband signal is provided by a first digital-to-analog converter according to a class B operation and the signal representing the magnitude of the quadrature component of the baseband signal is provided by a second digital-to-analog converter according to a class B operation.

* * * * *